United States Statutory Invention Registration [19]

[11] Reg. Number: H471

Visser [43] Published: May 3, 1988

[54] REMNANT FIELD DETECTOR

[75] Inventor: Age T. Visser, Geneva, Ill.

[73] Assignee: The United States of America as represented by the United States Department of Energy, Washington, D.C.

[21] Appl. No.: 934,518

[22] Filed: Nov. 24, 1986

[51] Int. Cl.[4] ..... G01N 27/72

[52] U.S. Cl. ..... 324/239; 324/260

*Primary Examiner*—Deborah L. Kyle
*Assistant Examiner*—John E. Griffiths
*Attorney, Agent, or Firm*—Paul A. Gottlieb; Judson R. Hightower

[57] ABSTRACT

A method apparatus for qualitatively detecting remnant magnetic fields in matched pairs of magnet cores. Equal magnitude and oppositely oriented magnetic flux is induced in the magnet cores by oppositely wound primary windings and current source. Identically wound secondary windings generate output voltages in response to the induced flux. The output voltages generated should be of equal magnitude and opposite polarity if there is no remnant field in the cores. The output voltages will be unequal which is detected if either core has a remnant field.

7 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

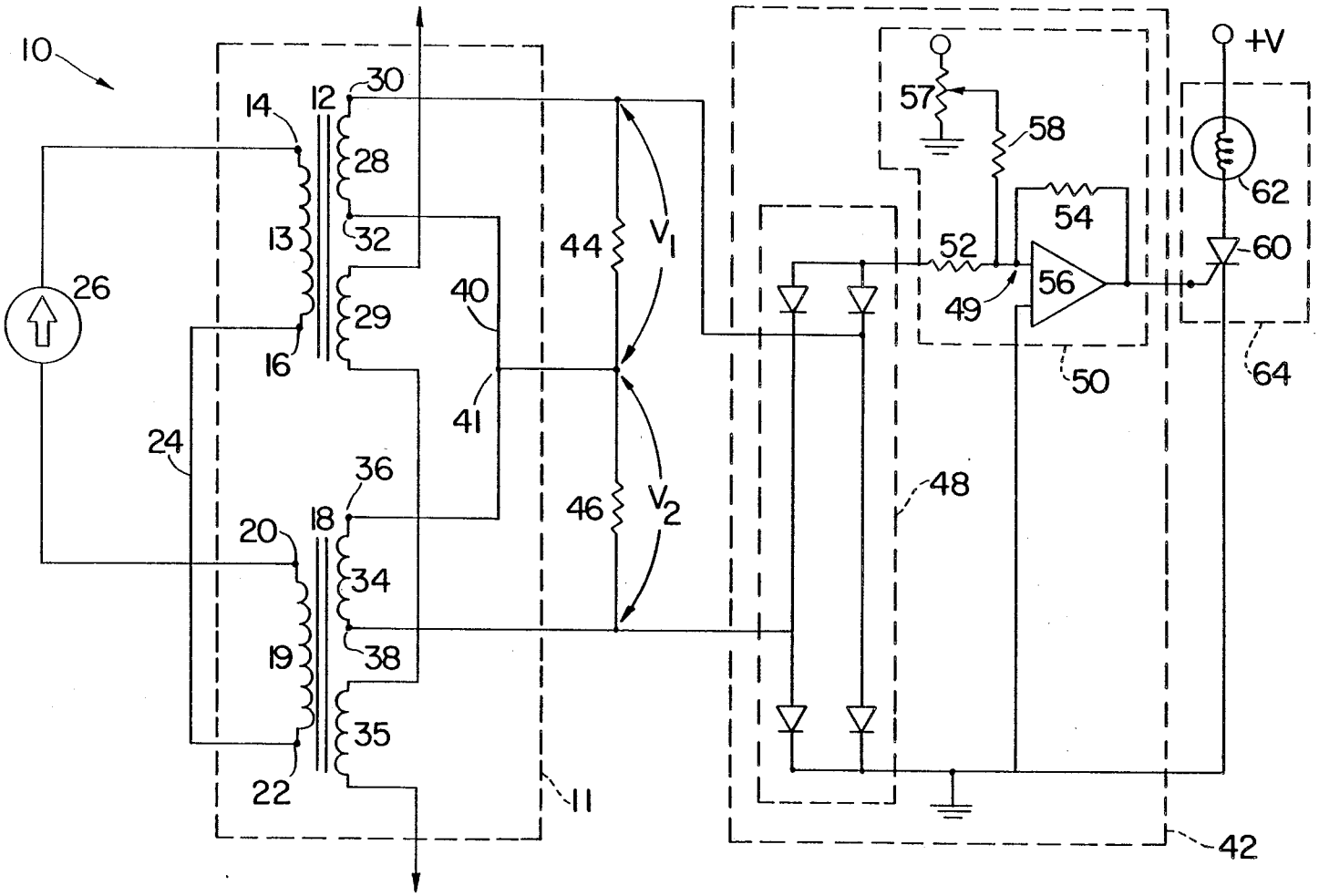
+V
62
60
64
42
54
56
50
58
49
52
57
48
V1
V2
44
46
11
40
41
30
28
32
29
36
34
38
35
12
18
14
13
16
20
19
22
24
26
10

REMNANT FIELD DETECTOR

CONTRACTUAL ORIGIN OF THE INVENTION

The U.S. Government has rights in this invention pursuant to Contract No. DE-AC02-76CH03000 between the U.S. Department of Energy and University Research Associates Inc.

BACKGROUND OF THE INVENTION

This invention relates to magnetization detectors for magnetic cores. Specifically, the invention is an apparatus and method for qualitatively detecting the absence or presence of residual magnetic fields in matched pairs of magnet cores.

In many instrumentation applications, particularly various high energy physics experiments which use electro magnet fields to steer charged particles it is desirable to be able to measure the condition of electro magnet cores used in the experiment to detemine whether or not there are residual fields in the magnetic cores left over from a previous excitation which might distort or disturb calibration of other test equipment used to evaluate experimental results. In particular, it has been found important in various experiments at the Fermi Lab Accelerator to be able to determine the state of magnetic cores prior to the conducting of an experiment. At Fermi Lab, a 110 foot long muon pipe comprised of 220 individual tape wound steel toroids is used to deflect unwanted halo muons in certain types of high energy physics experiments. Tests need to be conducted with and without the magnetic field provided by the assembly of magnet cores. A degausing current is passed through the coil windings to reduce the magnetic field to zero before an experiment is run.

Degausing a magnetized core typically requries the application of an alternating excitation current which is gradually decreased to zero amplitude. This process removes the existing remnant magnetic field from the core.

Since the process of degausing requires the application of a decreasing alternating current to the core it is possible to have residual fields left over from the degausing process itself, or previous excitation. It is desirable to be able to detect the presence of any remnant magnetic field left over from the degausing process itself, or not completely removed by the degausing process.

Remnant magnetic field detectors used to detect the presence of magnetic fields in cores are not new and were probably most widely used in computer memory devices, the direction of the residual magnetic field in the cores arbitrarilly being chosen to represent either a binary one or zero. The magnetic core memory is usually "read" by pumping an electric current through a driving coil wrapped around the magnet core. The electric current passing through the driving coil flows in some predetermined direction and induces a directional magnetic field in the core. A sense coil winding also wrapped around the magnet core has a voltage induced in it by magnetic flux changes in the magnet core.

If a current pulse through the driving coil causes a magnetic flux direction change in the core, a voltage pulse is detected at the sense coil in response to the current pulse through driving coil if the residual flux in the core is opposite the direction of the flux generated by the driving coil. If the current pulse through the driving coil did not cause a flux reversal in the core, no flux change is created hence, no output voltage is generated at the sense coil winding.

In the muon pipe described above, wherein individual identical cores must be degaussed and the state of the cores after degausing must determine that it is practically impossible to disassemble and reassemble an assembly of 220 individual cores in any efficient manner. Using individual sense windings on each magnet core would also be prohibitively complex. It is desirable to be able to detect remnant magnetic fields in a typical magnet core or cores, which represents the muon pipe without having to disassemble the muon pipe.

Accordingly, it is therefore an object of the present invention to provide a means to detect remnant magnetic fields in magnetic cores.

It is therefore another object of the present invention to provide a means for detecting remnant magnetic fields in matched magnet core pairs.

Another object of the invention is to provide a means for remotely sensing the existance of remnant fields in matched magnetic core pairs.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combination particularly pointed out in the appended claims.

SUMMARY OF THE INVENTION

To achieve the foregoing objects of the invention there is provided a remnant field detector for detecting residual magnetic fields in matched magnet core pairs.

Two magnet cores, the magnetization of which is to be measured, are physically and electrically separated and are wound with opposing primary windings. A driving current source provides a current pulse to both primary windings which induces a magnetic flux change in each magnet core. The opposing primary windings are wound on the magnet cores such that the direction of the magnetic flux induced by the driving current in each core is opposite that of the other.

Secondary coil windings are wound on each magnet core and connected electrically in series. Voltage generated across each secondary winding, in response to the current pulse provided by the driving current source, is compared in magnitude. Since the primary coils are wound with an opposing orientation, the flux generated in the cores by the device current flows in opposite directions. The output voltages generated at the secondary windings in response to the flux generated by current flowing through the primaries should produce equal magnitude and opposite polarity output voltages at each secondary winding, if there are no remnant fields in the cores. Any difference voltage at the secondary windings, i.e. the voltage difference between the two secondary windings, is used to trigger a trigger circuit, the output of which is monitored to indicate that there was a residual field in the magnet core pairs that was detected.

As used in the muon detector, two sample cores, electrically identical, but physically separated from the muon detector i.e. remote from the assembly of 220 cores, are both wound with a run coil, identical to and in series with the run coils wound on each of the other 220 individual cores. When the muon pipe cores are magnetized by a current through the run winding the two sample cores are also magnetized. When a degaussing signal is applied to the run windings to degauss the 220 cores, the sample cores are exposed to the same degaussing signal. Using two sample cores as such permits remote testing of the magnet cores used in the muon pipe. However, two of the actual muon pipe magnet cores could be wound with the test coils described above without affecting the validity of test data from the invention.

BRIEF DESCRIPTION OF THE DRAWINGS

The FIGURE shows a schematic diagram representative of the preferred embodiment to the invention.

DETAILED DESCRIPTION OF THE PREFERRED EMBODIMENT

Referring to the figure, there is shown a representative schematic diagram of a remnant field detector 10. A coil winding assembly 11 receives a driving current pulse from a current source 26. The output voltage of the secondary circuit of the coil winding assembly 11 is monitored by voltage comparison circuit 42 which in turn provides a readable output voltage to an indicator circuit 64; via adjustable threshold detector 56.

Referring to the coil assembly 11, there is shown a magnet core 12 with a first primary winding 13 having two connection nodes, 14 and 16 as shown. The primary coil 13 is wound on the magnet core 12 and in the preferred embodiment was 20 turns of wire. Magnet core 18 also has a primary winding 19 with two connection nodes 20 and 22 as shown in the figure. Coil winding 19 of the embodiment shown in the figure also was 20 turns of wire, wound on core 18.

Magnet core 12 and magnet core 18 were both 1 inch sections of the same tape wound steel magnet core of the muon pipe, as closely matched as possible with respect to their physical and electrical characteristics to provide accurate remnant field detection.

Run-degaussing windings, 29 and 35, identical to the run-degaussing windings wound on the other cores of the muon pipe, are wound on the detector cores 12 and 18. Run current and degaussing current through the run-degaussing windings 29 and 35 puts the cores 12 and 18 in the same magnetic state as the muon pipe cores.

It is shown that the second node 16 of coil 13 is connected to the second node 22 of winding 19 by a wire 24. The winding of the coils 13 and 19 on cores 12 and 18 is such that current induced in the primary circuits by a current source 26 induces magnet flux in cores 12 and 18 in opposite directions. A current from current source 26 flows into node 14 of coil 13 exits node 16 enters node 22 of winding 19 and exits winding 19 at node 20 to return to the current source 26.

In the preferred embodiment the driving current source 26 was simply a capacitor of 250 uF charged to 30 V. A switching mechanism switched the current source into the circuit of windings 13 and 19 to provide a driving current pulse for remnant field detection. Current source 26 could be implemented by any other number of means known in the art, for example a current source implemented by transistors or operational amplifiers could suitably function to provide a driving current pulse.

A secondary winding wound on each magnet core 12 and 18 provides an output voltage to be measured. Secondary winding 28, in the preferred embodiment was forty turns of wire, and has two connection nodes 30 and 32 as shown. Secondary winding 34, on core 38 was also forty turns of wire and has two connection nodes 36 and 38 as shown. A wire 40, as shown in the figure formed a common node 41 to windings 28 and 34. Windings 28 and 34 as connected in the secondary of cores 12 and 18 form a series connected transformer pair.

Voltages induced in the secondary windings 28 and 34 in response to the driving current passing through primary windings 13 and 19, produce voltages V1 and V2 across nodes 38 and 30 with respect to node 41 as shown. Since cores 12 and 18 will have identical magnetic fields after degausing, i.e. equal remnant fields or equal zero fields, and since the orientation of the magnetic field induced by current through windings 13 and 19 from current source 26 will have opposite orientation in the cores, node 41 is the common potential for the voltages in the secondary circuit comprised of windings 28 and 34.

The voltages V1 and V2 as shown in the figure are monitored by a voltage comparison circuit 42. Two resistors, 44 and 46, load the windings 28 and 34 to reduce noise.

The sum of voltages V1 and V2 is rectified by bridge rectifier 48 as shown, to present a unipolar voltage at node 49 of the threshold detector 56. The unipolar signal permits the use of a very simple detector.

The output of the bridge rectifier 48 is or may be very small in magnitude if the voltages V1 and V2 are very close in magnitude. As the condition of cores 12 and 18 approaches complete demagnetization after degausing, i.e. the cores 12 and 18 are without remnant fields the magnitude of the output voltages V1 and V2 will get closer to equivalents. As such, the output detector circuit 42 will be zero when degausing was perfectly performed.

A voltage detector 50, was implemented using a conventional operational amplifier as the threshold detector 56 with an adjustable input trip level, accomplished by resistors 57 and 58. Any suitable operational amplifier could serve the function required to provide voltage detection. Those skilled in the art will realize that different input bias currents, input offset voltages among other factors will determine the selection of the device for voltage detection and gain of voltage detector 50.

If magnet cores 12 and 18 have no residual magnet field after degausing the flux change generated by the driving current flowing from current source 26 through windings 13 and 19 will produce equal and opposite magnet fields in cores 12 and 18 which will in turn effect inducement of equal and opposite polarity voltages V1 and V2 in the secondary windings. If V1 and V2 are equal as such, the output of voltage detector 50 will also be zero. If magnet cores 12 and 18 have some residual magnetic field therein, magnet flux generated in response to current source 26 through windings 13 and 19 will cause one of the magnet cores 12 or 18 to undergo a magnetic flux change exceeding the other producing a difference between voltage V1 and V2. If magnet cores 12 and 18 have some residual magnetic field V1 will differ from V2 and the output from voltage detector 50 will be a non-zero, the polarity of the output of detector 50 being controlled by the orientation and connection of the bridge rectifier 48.

In the preferred embodiment as used at Fermi Lab, the output of voltage detector 50, when non zero, was used to trigger a silicon controlled rectifier 60 which, in turn, controlled an indicator 62 which could be any appropriate indication device.

Voltage comparison block 42 and the output indication block 64 could be implemented by any of a number of a equivalent functional circuits. Voltage comparators could be used directly across V1 and V2 for instance to more directly measure the difference in magnitude between these two voltages. Appropriate logic devices could be used to latch or store the results of voltage comparison of voltage V1 and V2 rather than using a silicon controlled rectifier as shown.

Those skilled in the art will also realize that appropriate zeroing circuits might be required, dependent upon the selection of operational amplifiers or gain blocks for threshold detector 56 as would nulling circuits for the resistors 44 and 46. Nulling circuits were omitted from the figure for clarity.

The embodiments in which an exclusive property or privilege is claimed are defined as follows:

1. A magnetic field detector for detecting remnant magnetic fields in magnet cores associated with an apparatus having multiple magnet cores to be degaussed, said remnant field detector comprised of:

first and second matched magnet cores;

flux generator means coupled to said first and second magnet cores capable of inducing a predetermined magnetic flux in said first magnet core with a predetermined orientation and inducing a predetermined magentic flux in said second magnet core with an orientation opposite said orientation of said first flux in said first magnet core;

first flux sensor means coupled to said first magnet core, capable of generating an output voltage from magnetic flux change in said first magnet core;

second flux sensor means coupled to said second magnet core for generating an output voltage from magnetic flux change in said second magnet core;

voltage comparison means coupled to said first flux sensor means and coupled to said second flux sensor means, capable of producing an output signal indicating a difference in output voltage from said first flux sensor means and from said second flux sensor means;

whereby magnetic flux change generated in said magnet cores by said flux generator means causes an induced voltage in said first and second flux sensor means the magnitude and polarity of such voltages in said first and second sensor means being dependent upon remnant magnetic fields in said magnetic cores prior to induced flux in said cores from said flux generator means.

2. The apparatus of claim 1 where said flux generator means includes first and second coil windings wound on said first and second magnet cores with opposite orientation and a current source .

3. The apparatus of claim 2 where said the first sensor means includes a secondary winding wound on said first magnet core.

4. The apparatus of claim 3 where said second sensor means includes a secondary winding wound on said second magnet core.

5. The apparatus of claim 4 where said voltage comparison means is a bridge rectifier and operational an amplifier coupled to said secondary windings on said first and second magnet cores.

6. The apparatus of claim 4 where said voltage comparison means is a voltage comparator connected to said secondary windings on said first and said second magnet cores.

7. A method for detecting remnant magnetic fields in matched pairs of first and second magnet cores said method comprised of:

a predetermined magnetic flux in a first magnet core of one of said matched pairs with a predetermined orientation;

inducing a predetermined magnetic flux in a second magnet core of said one matched pair with an orientation opposite said orientation of said flux in said first magnet core;

measuring a voltage induced in a secondary winding on said first magnet core in response to said induced magnetic flux;

measuring an induced voltage in a secondary winding on said second magnet core in response to said induced magnetic flux in said second magnet core;

comparing the output voltages from the secondary windings on said first and second magnet cores and producing a measurable output voltage or signal the status of which indicates that a remnant magnetic field was present in the magnet cores prior to the application of said magnetic flux.

* * * * *